(12) United States Patent
Audet et al.

(10) Patent No.: US 6,762,367 B2
(45) Date of Patent: Jul. 13, 2004

(54) ELECTRONIC PACKAGE HAVING HIGH DENSITY SIGNAL WIRES WITH LOW RESISTANCE

(75) Inventors: Jean Audet, Granby (CA); Timothy W. Budell, Colchester, VT (US); Patrick H. Buffet, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/246,147

(22) Filed: Sep. 17, 2002

(65) Prior Publication Data

US 2004/0050585 A1 Mar. 18, 2004

(51) Int. Cl.[7] .............................................. H05K 1/03
(52) U.S. Cl. ...................... 174/255; 174/260; 174/264; 361/795
(58) Field of Search .......................... 174/255, 260–266; 361/792–795

(56) References Cited

U.S. PATENT DOCUMENTS

| | | | |
|---|---|---|---|
| 4,736,276 A | * | 4/1988 | Ushifusa et al. ............ 361/792 |
| 4,847,732 A | * | 7/1989 | Stopper et al. ............. 361/739 |
| 5,119,048 A | | 6/1992 | Grunwell |
| 5,375,042 A | * | 12/1994 | Arima et al. ............... 361/784 |
| 5,808,521 A | | 9/1998 | Tosaka |
| 5,986,893 A | | 11/1999 | Leigh et al. |
| 6,118,666 A | | 9/2000 | Aoki et al. |
| 6,150,895 A | | 11/2000 | Steigerwald et al. |
| 6,172,305 B1 | | 1/2001 | Tanahashi |
| 6,198,635 B1 | * | 3/2001 | Shenoy et al. ............. 361/760 |
| 6,326,561 B1 | * | 12/2001 | Watanabe et al. ........... 174/264 |
| 6,329,610 B1 | * | 12/2001 | Takubo et al. ............. 174/264 |
| 6,528,735 B1 | * | 3/2003 | Bhatia et al. ............... 174/260 |
| 6,534,723 B1 | * | 3/2003 | Asai et al. ................. 174/255 |
| 6,535,398 B1 | * | 3/2003 | Moresco ..................... 361/792 |

FOREIGN PATENT DOCUMENTS

JP          9018156          1/1997

* cited by examiner

*Primary Examiner*—Kamand Cuneo
*Assistant Examiner*—Jose H. Alcala
(74) *Attorney, Agent, or Firm*—DeLio & Peterson, LLC; Robert Curcio; Ira D. Blecker (57) ABSTRACT

In the present invention an electronic package assembly includes an integrated circuit positioned on a substrate. The substrate has substantially horizontal layers including horizontal signal wires having vertical thicknesses and resistance. In a preferred embodiment, first and second vertical thicknesses of the signal wires alternate from the top to the bottom of the substrate such that the signal wires with greater vertical thicknesses have lower resistance than the signal wires would typically have. A plurality of substantially vertical conductive vias traverse the horizontal layers such that the vertical conductive vias connect to the integrated circuit and connect with at least one of the horizontal signal wires. A circuit board positioned beneath the substrate includes connection members for connecting with, and terminating the vertical conductive vias.

26 Claims, 8 Drawing Sheets

ELECTRONIC PACKAGE HAVING HIGH DENSITY SIGNAL WIRES WITH LOW RESISTANCE

BACKGROUND OF THE INVENTION

1. Field of the Invention

The present invention relates to electronic packages including an electrical component connected to a substrate having a plurality of substantially vertical and horizontal signal wires distributed through the substrate, and more particularly, to an electronic package having an integrated circuit connected to a substrate having a plurality of substantially vertical and horizontal signal wires distributed through the substrate and defining multiple layers in the substrate terminating at a circuit board.

2. Description of Related Art

Current electronic packages may include multiple signal wires which define layers in a substrate The wiring layers within the substrate may be of varying widths and lengths. Each layer may offer specific wiring density and resistance attributes. Signal wires in a given layer may be manufactured with a low density and a low resistance by, for example, using large width wires. Further, signal wires may be manufactured having a high density and a high resistance by, for example, using small width wires. Generally, high density wiring allows fewer wiring layers, however, low resistance wiring results in better performance. Typically, about twelve to twenty layers of signal wires are in the substrate. Commonly, reference metal or reference material is also positioned in one or more layers in the substrate to provide current from a power supply outside the electronic package, and an electrical return path.

Typically, an electrical component, such as a die or integrated circuit is positioned on the package substrate. The integrated circuit has electrical contacts which contact the package substrate. Once positioned on the package substrate, the integrated circuit defines a die shadow on the package substrate generally equal to the perimeter of the die or integrated circuit. The electrical contacts may include, for example, solder balls. Thin signal wires may be used to enhance signal wire density in the package substrate proximate to the electrical contacts of the integrated circuit. The signal wires themselves can vary in thickness as they pass through the substrate.

Known in the art are multi-layered circuit boards having signal wiring conductors arranged on a first or second insulating layer, and signal wiring conductors arranged on a third or fourth insulating layer. The insulating layers are sequentially overlayed by arranging the signal wiring conductors on the same insulating layers substantially parallel to each other. Wiring conductors can also be arranged in parallel while interposing an insulating layer therebetween. The wiring on successive insulating layers may intersect at right angles using signal wires or vias. Ground and power wiring conductors are connected using conductors distributed through the insulating layers.

Other known devices include printed wiring boards including first and second overlapping boards. A conductive wiring pattern is formed on a portion of the first flexible board including an inspectional land used to inspect the conductive pattern on the flexible board. The first and second flexible boards overlap such that the conductive wiring pattern and the inspectional land do not overlap each other in a direction parallel to a plane which is parallel to the first and second flexible boards.

There are disadvantages of the known methods described herein for connecting integrated circuits or electrical components through the substrate to terminate at the circuit board or termination structure. The desire to increase the density of signal wires connected to the electrical connections of, for example, the integrated circuit leads to thinner signal wires, having undesirable resistance attributes. Thus, the known devices typically include thin or small width signal wires in congested areas resulting in undesirably high resistance in the signal wires in those areas in the package substrate. Also, other devices may provide a signal wire starting with a thin, narrow layer which may widen or increase in thickness or width. However, one of the disadvantages of this method is a low resulting characteristic impedance.

Bearing in mind the problems and deficiencies of the prior art, it is therefore an object of the present invention to provide an electronic packaging device having increased signal wire density with lower signal wire resistance.

It is another object of the present invention to provide an electronic packaging device which provides communicating signal wires of varying thicknesses and positioning in a substrate.

It is yet another object of the present invention to provide an electronic packaging device having multiple reference planes.

It is another object of the present invention to provide a method of electronic packaging having increased signal wire density with lower signal wire resistance.

It is yet another object of the present invention to provide a method of electronic packaging providing signal wires having multiple thicknesses.

It is a further object of the present invention to provide a method of electronic packaging having multiple reference planes.

SUMMARY OF THE INVENTION

An electronic package device connected to a power source which comprises an electrical component including a plurality of connection elements on a surface thereof. A substrate having top and bottom surfaces is positioned beneath the electrical component and adapted to receive the connection elements of the electrical component on the top surface thereof. The substrate defines a plurality of horizontal layers, and a plurality of substantially horizontal conductive signal wires traversing the substrate along the horizontal layers in the substrate such that a first horizontal signal wire travels along a first substantially horizontal layer. The first signal wire includes a first vertical thickness which may be less than about 150 microns, and a first resistance measurement. A second horizontal signal wire travels along a second horizontal layer positioned beneath the first horizontal layer. The second signal wire has a second vertical thickness greater than the first vertical thickness of the first horizontal signal wire, and may also be less than about 150 microns, and a second resistance being lower than the first resistance of the first horizontal signal wire. At least one substantially horizontal reference plane is within the substrate along one of the substantially horizontal layers. The reference plane includes a vertical thickness and the power source is connected to the horizontal reference plane. The device further includes a plurality of substantially vertical conductive vias having a specified diameter, and at least one of the conductive vias may communicate with a multiplicity of the horizontal signal wires. The plurality of substantially vertical vias may have a diameter being less than about 120 microns, and include a first vertical via traversing the first and second horizontal layers such that the first via connects to the connection element and connects to at least one of the horizontal signal wires. An insulated board having connection members is positioned beneath the substrate such that the vertical conductive vias terminate and connect to the connection members.

In a related aspect the first and second vertical thickness of the first and second horizontal signal wire are between about 1–150 microns.

In another related aspect the diameter of the vertical conductive vias are between about 3–120 microns.

In still another related aspect the plurality of reference planes include reference planes having different voltages from one another.

In yet another related aspect the reference planes each have a voltage and the reference planes having a substantially similar voltage are connected.

In another related aspect the horizontal signal wires are positioned between at least two of the reference planes such that the first signal wire is positioned between a first reference plane and a second reference plane. The first reference plane is positioned along the first layer and includes a first vertical thickness, and the second reference plane is positioned along the second layer and includes a second vertical thickness.

In yet another related aspect the substrate includes a plurality of reference planes such that the vertical thickness of the reference planes increases as the reference planes are nearer the bottom of the substrate.

In still another related aspect the plurality of the conductive signal wires alternate thicknesses such that the first signal wire including the first vertical thickness and the second signal wire including the second vertical thickness and a third horizontal signal wire traveling along a third substantially horizontal layer positioned beneath the second horizontal layer in the substrate includes a third vertical thickness substantially equal to the first vertical thickness and a fourth horizontal signal wire travels along a fourth substantially horizontal layer positioned beneath the third horizontal layer in the substrate and includes a fourth vertical thickness substantially equal to the second vertical thickness.

In another related aspect the substrate includes a plurality of the reference planes being coincident with the plurality of layers.

In another aspect of the present invention, an electronic package device connected to a power source comprises an integrated circuit including a plurality of connection elements on a surface thereof. A substrate has top and bottom surfaces being positioned beneath the integrated circuit and is adapted to receive the connection elements of the integrated circuit on the top surface thereof. The substrate defines a plurality of horizontal layers. A plurality of substantially horizontal conductive signal wires traversing the substrate along the horizontal layers in the substrate such that a first horizontal signal wire travels along a first substantially horizontal layer. The first signal wire includes a first vertical thickness of less than about 150 microns and a first resistance. A second horizontal signal wire travels along a second horizontal layer positioned beneath the first horizontal layer in the substrate. The second signal wire has a second vertical thickness being greater than the first vertical thickness of the first horizontal signal wire, and a second resistance is lower than the first resistance of the first signal wire. A plurality of reference planes are within the substrate along the substantially horizontal layers and include a vertical thickness, the horizontal signal wires are positioned between at least two of the reference planes such that the first signal wire is positioned between a first reference plane having a first vertical thickness, and a second reference plane having a second vertical thickness. The first reference plane is positioned along the first layer and the second reference plane is positioned along the second layer. At least one of the plurality of reference planes includes conductive metal for connecting to and receiving current from the power source. The device includes a plurality of substantially vertical conductive vias having a specified diameter of less than about 100 microns. The plurality of substantially vertical conductive vias include a first vertical via traversing the first and second horizontal layers such that the first vertical conductive via connects to the connection elements of the integrated circuit and connects with at least one of the horizontal signal wires. A circuit board has connection members and is positioned beneath the substrate such that the vertical conductive vias connect and terminate with the connection members of the circuit board.

In a related aspect the plurality of reference planes include different voltages from one another.

In another related aspect the reference planes each have a voltage value and the reference planes having a substantially similar voltage value are connected.

In still another related aspect at least one of the vertical vias communicates with a multiplicity of the horizontal signal wires.

In yet another aspect of the present invention, a method of electronic packaging comprises providing an integrated circuit having a plurality of connection elements positioned on a surface thereof. A substrate is provided and positioned beneath the integrated circuit and coupled to the connection elements of the integrated circuit. The substrate defines a plurality of horizontal layers. The method provides a plurality of substantially horizontal conductive signal wires along the horizontal layers in the substrate such that a first horizontal signal wire has a vertical thickness and a second horizontal signal wire has a vertical thickness being greater than the vertical thickness of the first signal line. A plurality of reference planes are provided within the substrate along the substantially horizontal layers and include a vertical thickness. At least one of the plurality of reference planes are connected to the power source wherein the reference plane includes conductive metal for receiving current from the power source. A plurality of substantially vertical conductive vias are provided having a specified diameter. The plurality of substantially vertical conductive vias include a first vertical via traversing the first and second horizontal layers such that the first vertical conductive via connects to the connection elements of the integrated circuit and connects with at least one of the horizontal signal wires. A circuit board having connection members is positioned beneath the substrate such that the vertical conductive vias connect and terminate to the connection members of the circuit board. The plurality of vias are connected to at least one of the horizontal signal wires including a first via traversing the first and second horizontal layers connecting to the connection element and connecting to the first horizontal signal wire.

In a related aspect the reference planes each have a voltage value and the reference planes having a substantially similar voltage value are connected.

In another related aspect, after the step of providing a plurality of substantially horizontal reference planes, horizontal signal wires are positioned between at least two of the plurality of reference planes such that the first signal wire is positioned between a first reference plane having a first vertical thickness and a second reference plane having a second vertical thickness. The first reference plane is positioned along the first layer and the second reference plane is positioned along the second layer.

In yet another related aspect, the plurality of reference planes include different voltages from one another.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(s)

In describing the preferred embodiment of the present invention, reference will be made herein to FIGS. 1–7 of the drawings in which like numerals refer to like features of the invention. Features of the invention are not necessarily shown to scale in the drawings.

Figure 1A:
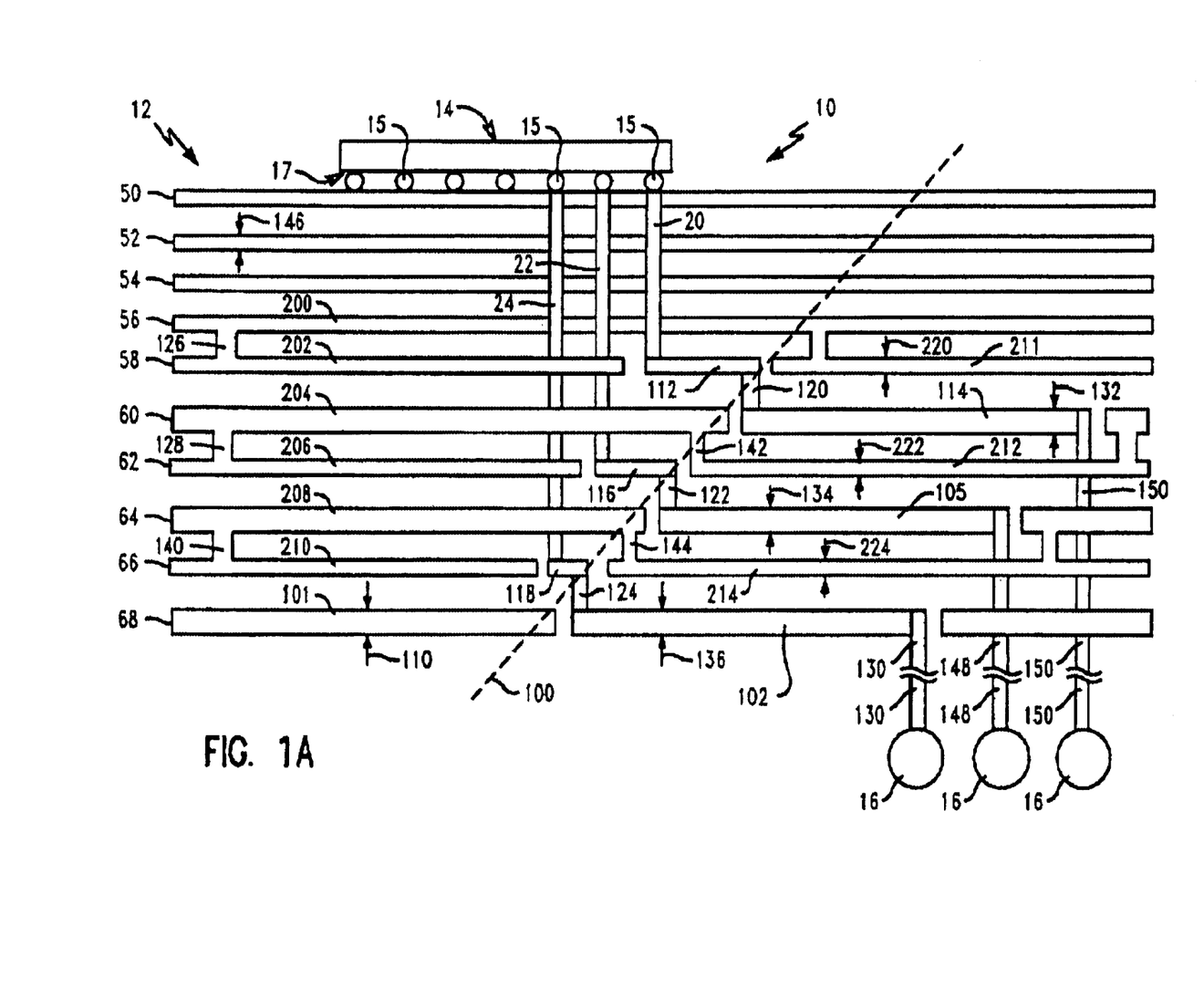
FIG. 1A is a cross sectional side elevational view of a preferred embodiment of an electronic package according to the present invention.

The present invention provides an electronic package device 10 and method to provide a high density of signal wires with low resistance in an electronic package. The electronic package includes segments of signal lines or signal wires having varying thicknesses positioned in different layers of a substrate. The signal wires are connected to provide electrical connectivity between a die, chip, or other electrical component and a circuit board or other electrical connection. The interconnections between the segments of signal wires located on different layers are made with substantially vertical signal wires or vias 20, 22, 24, as shown in FIG. 1. For example, such vias may preferably include conductive material or coatings or films of conductive material or materials. Further, the present invention provides for dividing reference planes by using the areas not occupied by signal wires. Thus, the present invention enables large packages including long signal wires to provide acceptable resistance, irrespective of the tendency for long signal wires to have increased resistance.

Figure 1B:
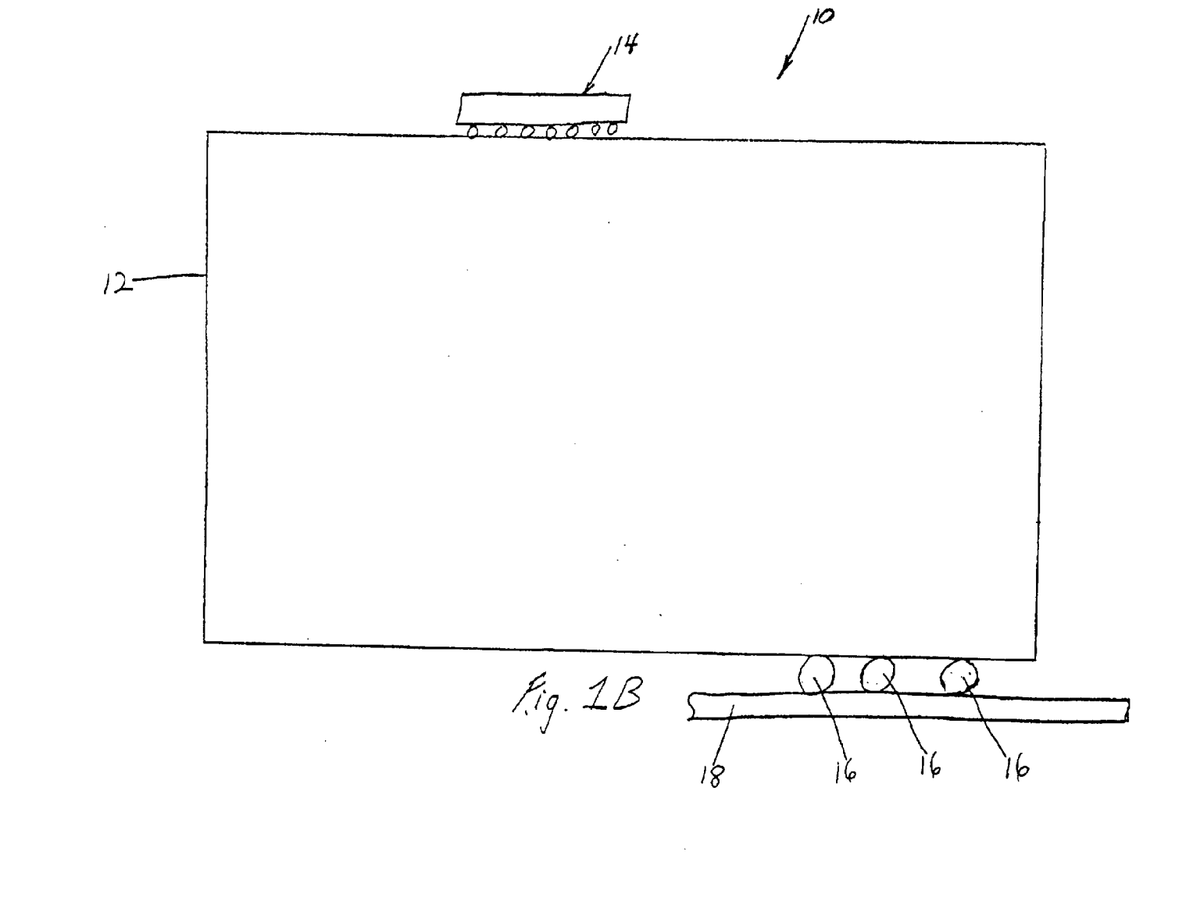
FIG. 1B is a side elevational view of the electronic package shown in FIG. 1A.
Figure 3:
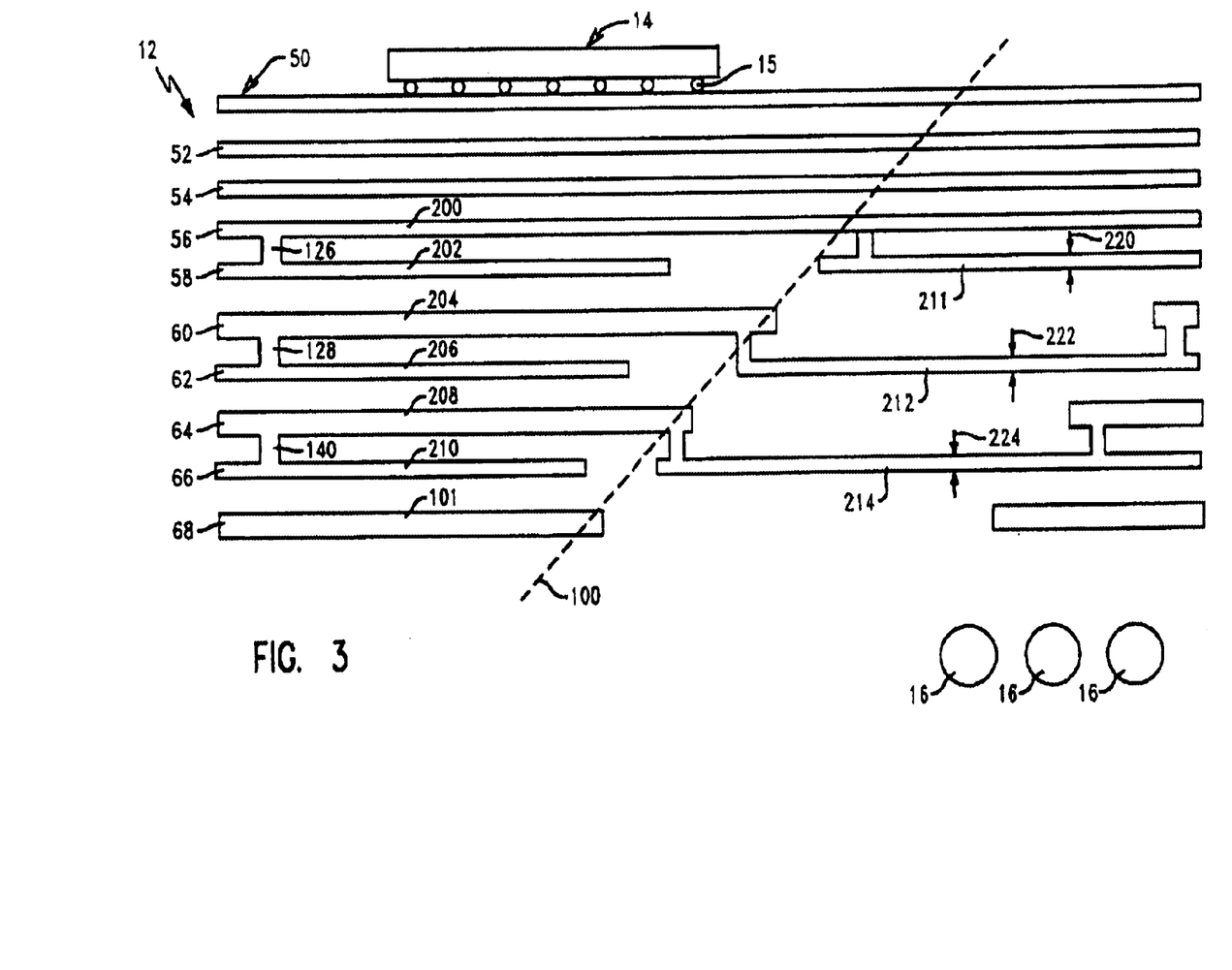
FIG. 3 is a cross sectional side elevational view of the electronic package of FIG. 1A depicting the reference planes.

Referring to FIGS. 1A, and 1B, a preferred embodiment of the present invention includes a die or integrated circuit 14 mounted on a substrate 12. The substrate 12 may preferably be made of ceramic, but may also be composed of a plastic substance, or another suitable material. The substrate 12 includes a top surface 50, and a series of planes or layers beneath the top surface 50. Referring to FIGS. 1A and 3, beneath the top surface 50 is a first layer 52, a second layer 54 beneath the first layer 52, a third layer 56 below the second layer 54, a fourth layer 58, a fifth layer 60, a sixth layer 62, a seventh layer 64, an eighth layer 66, and a ninth layer 68 below the previous layers, respectively.

Figure 2:
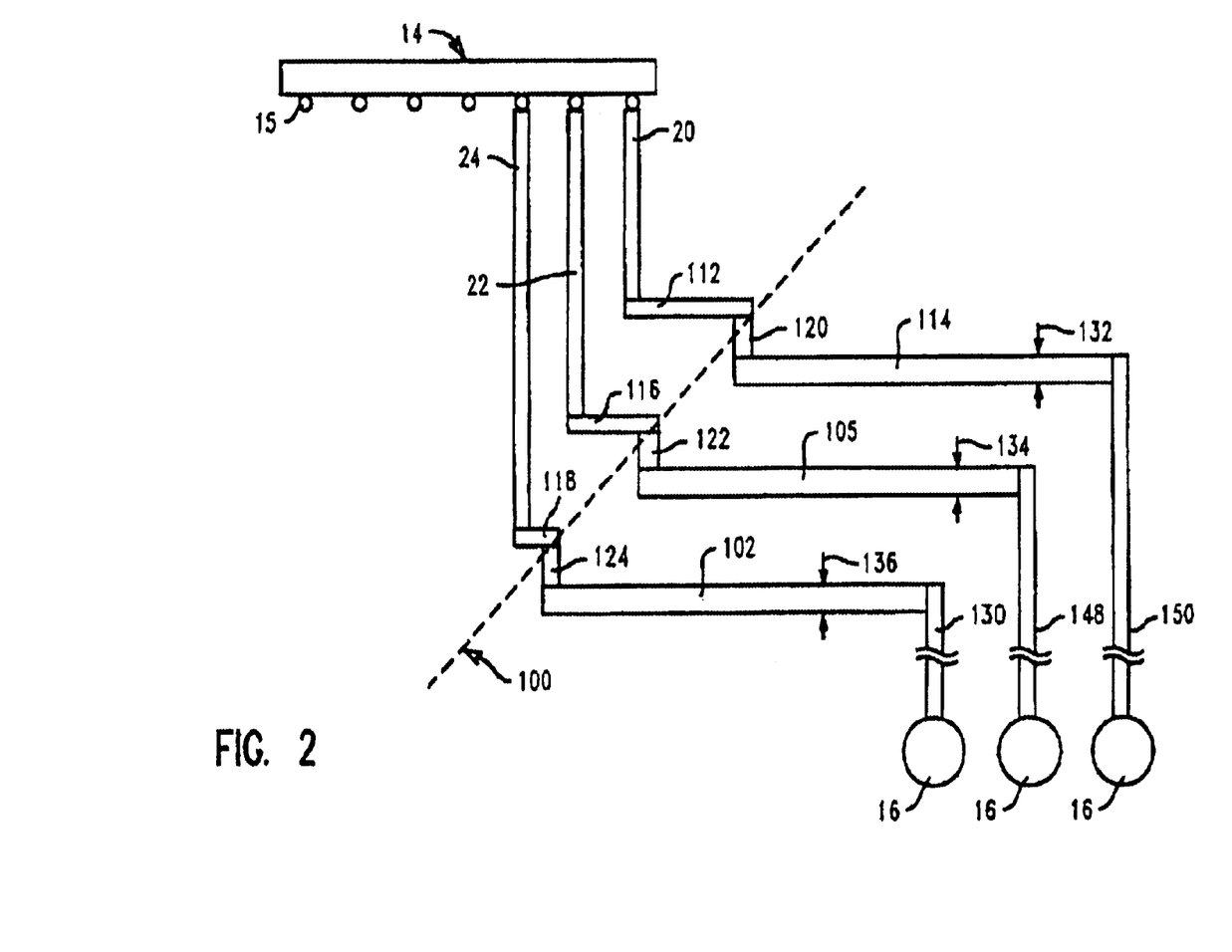
FIG. 2 is a cross sectional side elevational view of the electronic package of FIG. 1A depicting the signal lines.

In the preferred embodiment shown in FIGS. 1A and 3, each layer includes a reference plane segment to accommodate a plurality of voltages. However, another embodiment may include a single reference layer or plane for use with one voltage. Outside the area defined by the die shadow (outside the diagonal line 100 shown in FIGS. 1A, 2, and 3), the layers lower in the substrate include signal wire segments having more desirable resistance characteristics. The reference plane segments provide predictable electrical characteristics for the signal wires. Referring to FIGS. 1A, 2 and 3, the third layer 56 includes a third reference plane segment 200 connected to a fourth reference plane segment 202 below it in the substrate and part of the fourth layer 58, using a connection segment 126. Beneath the fourth reference plane segment 202, the fifth layer 60 includes a fifth reference plane segment 204 connected to a sixth reference plane segment 206 below it in the substrate and part of the sixth layer 62 using another connection segment 128. Beneath the sixth reference plane segment 206, the seventh layer 64 includes a seventh reference plane segment 208 connected to an eighth reference plane segment 210 below it in the substrate and part of the eighth layer 66 using another connection segment 140. The reference planes are preferably connected by the connection segments 126, 128, 140. Thus, each combination of connected reference planes preferably has the same voltage, for example, third reference plane segment 200 and fourth reference plane segment 202 connected by connection element 126 have a common voltage. Each connected combination of reference planes has a different voltage from each other providing multiple reference planes having different voltages.

The integrated circuit 14 preferably includes a plurality of solder contacts or, preferably, solder balls 15 positioned on a bottom surface 17 of the die or integrated circuit and connected to the top surface 50 of the substrate 12. The solder balls 15 or other means of electrical contact provide electrical connectivity between the die 14 and a plurality of vertical signal wires 20, 22, 24, shown in FIG. 1A positioned beneath the die 14. The plurality of signal wires are connected to each solder ball contact 15 on the integrated circuit providing a route for signals through the signal wires in the substrate from the integrated circuit to an electrical component connection 16 below the substrate, which may include, for example, solder connections positioned on a circuit board.

As shown in FIG. 1A, a first vertical signal wire or via 20 is shown as a singular via, but preferably includes a plurality of densely packed vertical signal wires. The via, as well as signal wires, may be manufactured by known processes, such as, etching or another suitable process.

The first via 20 is connected to the solder ball 15 and extends downwardly through the substrate 12. Similarly, a second via 22 connects to another solder ball 15 and extends downwardly, and likewise a third via 24 connects to another solder ball 15 and also extends downwardly through the substrate. Additional solder balls 15 on the bottom surface 17 of the die 14 preferably connect to other vias (not shown) and extend through the substrate layers to terminate at additional electrical component connections in a similar manner as the vias 20, 22, 24 shown in FIGS. 1A and 2.

Referring to FIGS. 1A and 2, the first vertical signal wire 20 is connected to a horizontal signal wire segment 112 positioned lower in the substrate and electronic package, and moving away from the die 14 along the horizontal plane 58. The horizontal signal wire segment 112 connects to a vertical segment 120 positioned beneath it, which connects to horizontal signal wire segment 114 positioned below the previous signal wire segment 112 in the substrate 12 and further away from the die 14. The horizontal signal wire segment 114 preferably includes a greater vertical thickness than signal wire segment 112. Finally, vertical signal wire segment 150, which is connected to the previous horizontal signal wire segment 114, terminates at the electrical component connection 16 adjacent to the bottom of the substrate 12.

Similarly, the second vertical signal wire 22 is connected to a horizontal signal wire segment 116. The vertical signal wire segment 122 is connected to horizontal signal wire segment 116 and continues on to connect to another horizontal signal wire segment 105 which preferably has a greater thickness than horizontal signal wire segment 116. The horizontal signal wire segment 105 is positioned below horizontal segments 116 and 114 and provides a connection, using segment 122, further away from the more densely packed signal wires of the second vertical signal wire 22. The horizontal signal wire segment 105 connects to the vertical segment 148 which terminates at the electrical component connection 16 adjacent to the bottom of the substrate 12, as with vertical signal wire segment 150.

Likewise, the third vertical signal wire 24 is connected to a horizontal signal wire segment 118, then connected to another vertical signal wire segment 124, and finally to a horizontal signal wire segment 102 having a greater thickness than horizontal signal wire segment 118, and being positioned below the other segment 118 and furthest beneath the die 14. Other embodiments may include more layers having signal wire segments and reference planes as required. The horizontal signal wire segment 102 connects to the vertical segment 130 which terminates at the electrical component connection 16 adjacent to the bottom of the substrate 12, as with vertical signal wire segments 150, and 148. The signal wires of segments 114, 105 and 102 having greater vertical thickness than segments 112, 116, and 118 respectively, provide the advantage of having less resistance. Thus, lower resistance is achieved by connecting the high density, vertically thin signal wires 112, 116, 118 from the die 14 or integrated circuit, to thicker signal wires 114, 105, 102 providing a lower resistance path terminating at electrical component connections 16 using corresponding vias 130, 148, 150.

As shown in FIG. 1B, the electrical component connections 16 include a plurality of solder contacts or solder balls connected, for example, to a circuit board 18, thus providing an electrical connection between the integrated circuit 14 and the circuit board 18 beneath the substrate 12 by means of the signal wires as described above.

The layers 52–68 in the substrate 12 preferably include signal wires of metal or conductive material, reference planes which provide voltage reference to the signal wires and power to the integrated circuit 14. Each layer preferably has a uniform vertical thickness as does the signal wires and reference planes within that layer. Preferably, the next horizontal signal wire beneath a previous horizontal signal wire has a greater vertical thickness. Thus, the thicker signal wires 114, 105, 102 have a lower resistance permitting electrical signals to pass through these signal wires meeting significantly lower resistance.

A diagonal reference line 100 divides the substrate signal wires across the layers 52–68. To the left of the reference line 100 is high density, high resistance horizontal signal wiring 112, 116, 118 and to the right of the reference line is low-density, low resistance horizontal signal wiring 114, 105, 102. For example, to the left of the reference line 100, the ninth layer 68 is used as a reference plane or ground. The section of the ninth layer 68 to the right of the reference line 100, is the horizontal signal wire 102. This convention is followed throughout FIGS. 1A, 2–3.

Preferably, the horizontal signal wires 114, 105 alternate with reference plane segments 211, 212, 214. The reference planes 211, 212, 214 preferably have equal vertical thicknesses 220, 222, 224, respectively, but may also have different vertical thicknesses from each other. Referring to FIGS. 1A and 3, the seventh reference plane segment 208 of the seventh layer 64 is connected using segment 140 with the eighth reference plane segment 210 of the eighth layer 66. The seventh reference plane segment 208, similarly to all the reference plane segments (which includes 200, 202, 204, 206, 208, 210, 101) provides predictable electrical characteristics for the signal wires. Commonly a signal wire is adjacent to a reference plane and may preferably be sandwiched between two reference planes. For example, the sixth layer 62 includes a reference plane segment 212 to the right of the reference line 100, the eighth layer 66 includes a reference plane segment 214 to the right of the reference line 100, and the seventh layer 64 includes a signal wire segment 105 between the reference plane segments 212 and 214. The sandwich-like positioning of the signal wire segment 105 includes the advantages of providing a reference which reduces loop inductance, as well as, reducing undesirable cross-talk effects. Cross-talk is undesirable because a quiet wire can become the victim of noise undesirably received from more active wires. Also, cross-talk is undesirable because of the loss of signal strength it causes as signals are being transmitted through the signal wires.

The electrically conductive vertical signal vias or signal wires 20, 22, 24 extend from the electrical connections 15 directly beneath the integrated circuit 14 and may be numerous and densely packed. These vias 20, 22, 24 are preferably connected to horizontal signal wires at multiple levels or layers within the substrate 12 where the horizontal signal wires include a specified vertical thickness which is advantageous and complimentary with the vertical signal wire. The vertical thickness of the horizontal signal wire may be less than or equal to about 100 microns, and may also be in the range of about 10 microns to 100 microns.

The vertical thickness of the horizontal signal wires 114, 105, 102 is preferably equal to each other, but may increase for the signal wires nearer the bottom of the substrate. Specifically, the fifth layer 60 includes horizontal signal wire segment 114 having a thickness 132 which is preferably equal to the ninth layer 68 horizontal signal wire 102 having a specified thickness 136, however, thickness 136 may have a thickness greater than thickness 134 and 132. Thus, preferably, the vertical thicknesses of the final horizontal signal wires 114, 105, 102, are equal. In an alternative embodiment, the vertical thicknesses may generally increase when moving from the top surface 50 toward the bottom of the substrate 12. The vertical signal wires may have a diameter less than or equal to about 120 microns, and also may have a diameter within the range of about 30 microns to 120 microns.

In operation, the signal wires extending from the electrical connection elements 15 on the bottom of the integrated circuit are preferably of a substantially similar thickness and provide dense packaging. The electrical signal is provided by a power source connected to the integrated circuit 14. The electrical current follows a path extending through the vertical signal wires or vias 20, 22, 24, and continuing through their associated segments terminating at electrical component connections 16. Each of the densely packaged signal wires can be connected to a preferred horizontal signal wire segment 112, 114, 116, 105, 118, and 102 positioned between their respective reference layers.

Each of the densely packaged signal wires, represented by vias 20, 22, 24, can be connected to a selected horizontal signal wire at a specific layer in the substrate. Thus is provided, a means for a narrow signal wire to escape the crowded integrated circuit or die 14 area connected to a thicker signal wire providing less resistance and increased performance. Once the connection is made to the thicker signal wire, the electrical connection to the termination point of the electrical connection member 16 on, for example, a circuit board is made.

Figure 4:
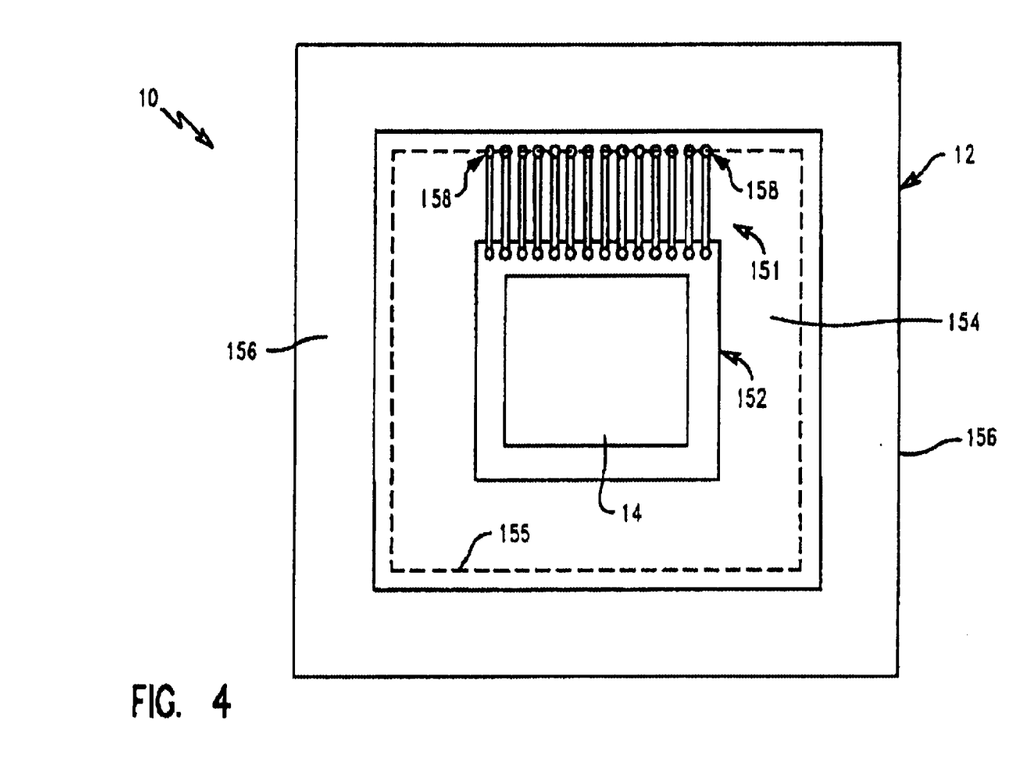
FIG. 4 is a cross sectional plan view of the electronic package shown in FIG. 1A depicting the die, signal wires, and reference planes.
Figure 5:
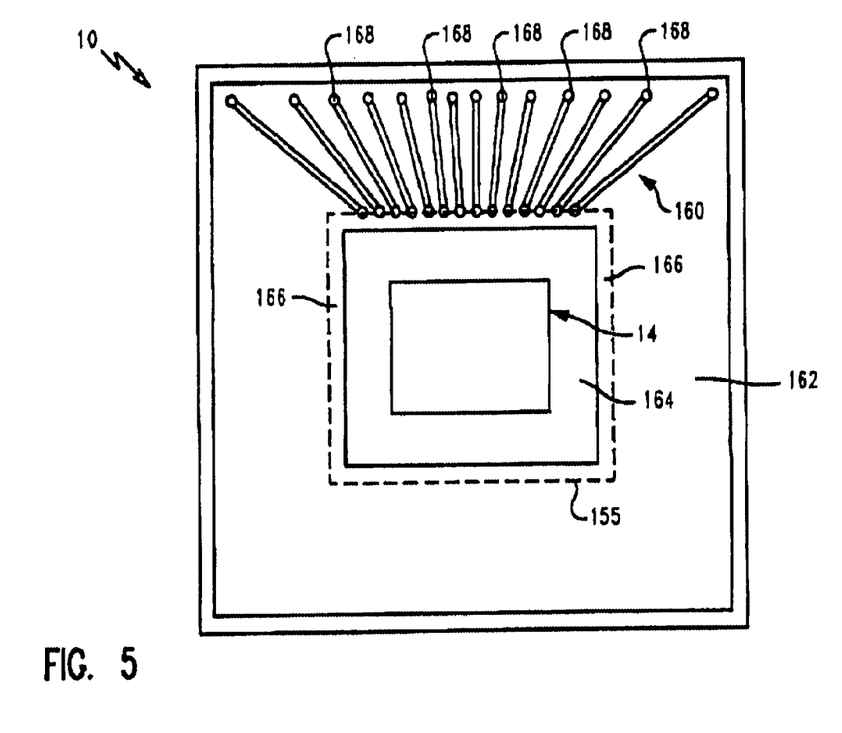
FIG. 5 is a cross sectional plan view of the electronic package shown in FIG. 1A depicting the die, signal wires, and reference planes at a deeper layer in the package.

Referring to FIGS. 4 and 5, FIG. 4 shows a cross-sectional layer in the electronic package which is substantially close to the top of the electronic package 10. FIG. 5 depicts a cross-sectional layer deeper or lower in the electronic package 10. These layers may be connected to each other using vias in a manner consistent with the illustrations of the present invention.

Referring to FIG. 4, the cross hatched area 156 depicts reference conductor material, and a low density, low resistance wiring area. In FIG. 4, the integrated circuit 14 is shown having signal wires 151 extending outwardly in the electronic package 10. Only one side of the die 14 is shown in FIGS. 4 and 5 having signal wires, preferably however, all four sides would have similar signal wire configurations, and other connections can also be present. The integrated circuit or die 14 is positioned on the substrate 12 and includes an outer edge 152 surrounding the die 14. A die shadow area 154 defines a portion of an escape region for densely packed high resistance wiring. The signal wires 151 extend from the die 14 outer edge 152 outwardly through the escape region defined by the die shadow area 154. There is no reference conductor material on the layer in the substrate where the signal wires 151 are escaping from the die 14 across the die shadow 154.

Referring to FIG. 5, the signal wires 160 fan-out in a diagonal direction from the die 14, at a lower level in the substrate than shown in FIG. 4. The signal wires can extend in many combinations of directions from the device, for example, orthogonally, or diagonally at various angles. The electronic package 10 also preferably includes orthogonally positioned signal wires (not shown), where signal wires extending from different regions of the die 14 traverse each other at substantially right angles. Reference conductor material 156 extends well past the die 14. Once the signal wires 160 extend outward from the die, more surface area is available for use. The signal wires are shown connecting at the perimeter of cross hatched area 164 surrounded by dotted line 155. The cross hatched area 164 includes reference conductor material. Vertically adjacent layers, above and below the cross hatched area 164, are adapted for high density, high resistance wiring. The signal wires 160 extend outwardly toward other, preferably less densely packed, signal wire connections 168. Further, the signal wires 160 are escaping from the die 14 through a substrate area 162 which does not contain reference conductor material on that layer. The substrate area 162 is adapted for low density, low resistance wiring. The wires 160 preferably surround all four sides of the die 14, and are shown in FIG. 5 extending from only one side for purposes of illustration.

Figure 6:
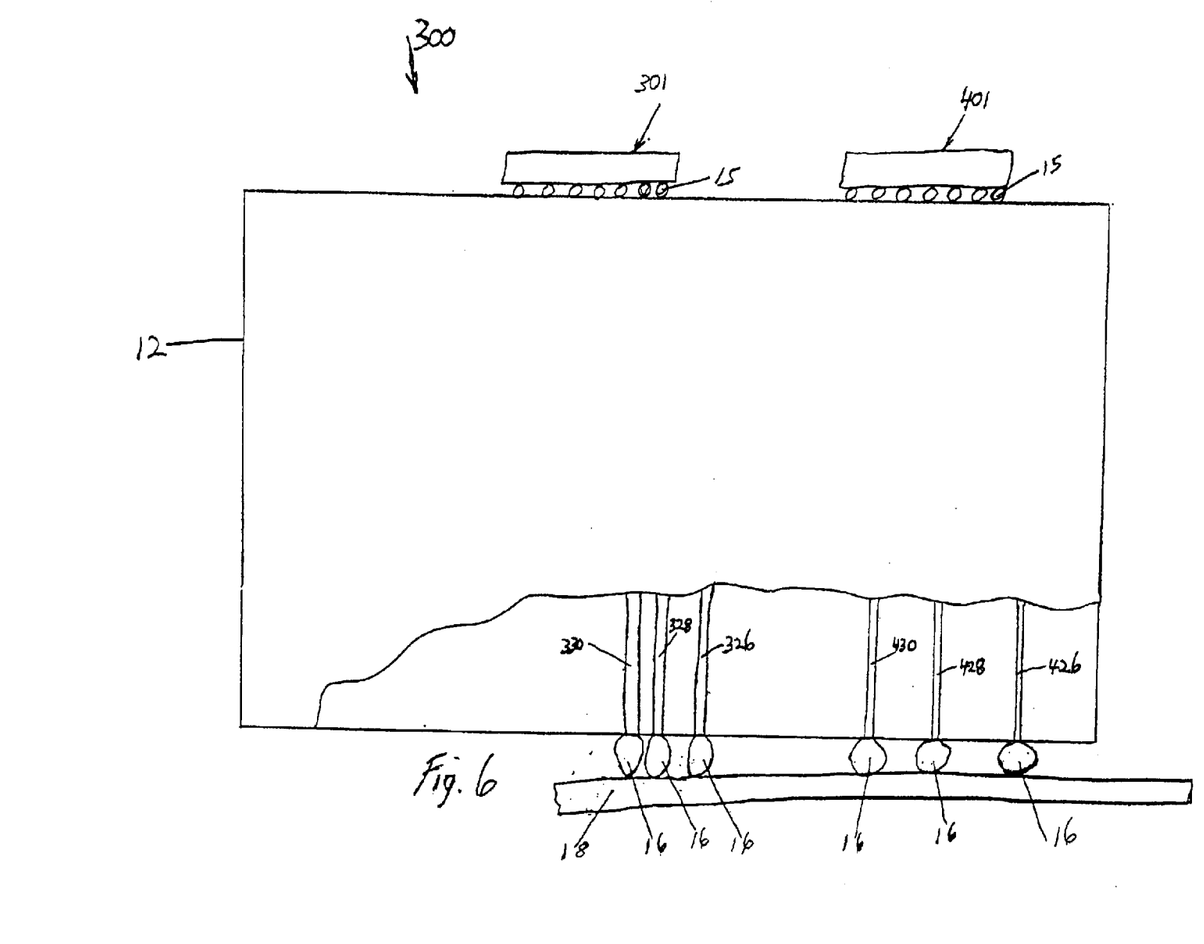
FIG. 6 is a partial cut-away side elevational view of another embodiment of the present invention having multiple dies.
Figure 7:
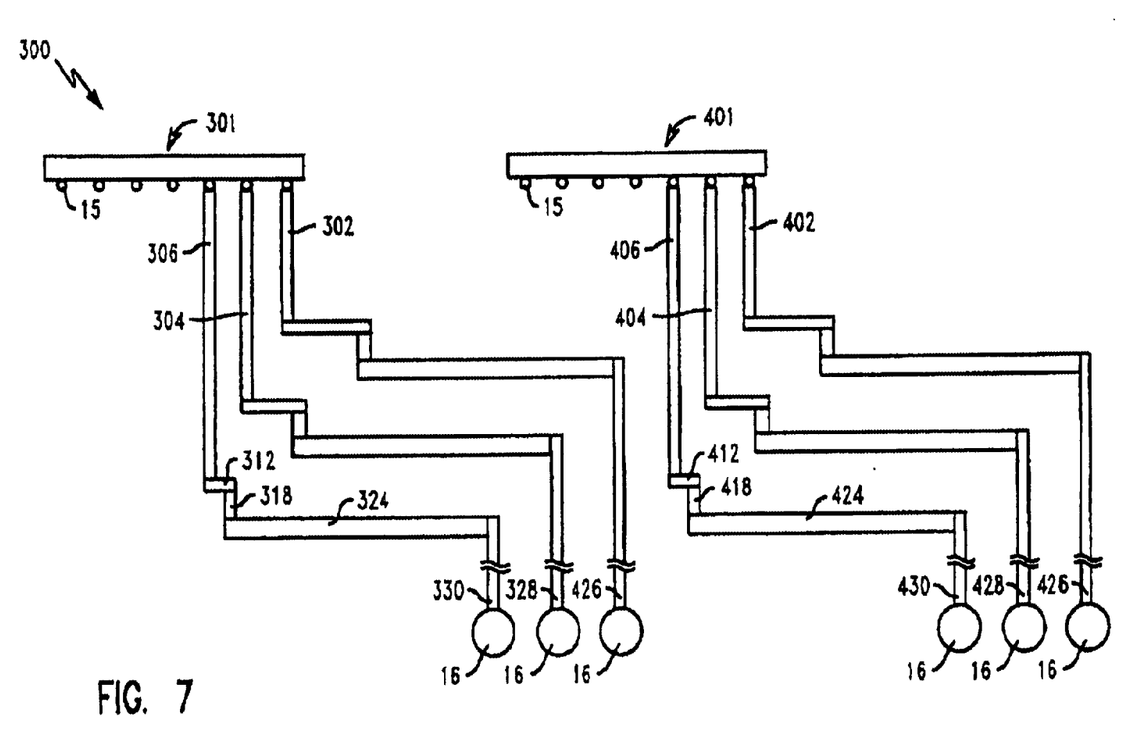
FIG. 7 is a cross-sectional side elevational view of the electronic package of FIG. 6 depicting signal lines.

Referring to FIGS. 6 and 7, another embodiment of an electronic package 300 according to the present invention is shown including multiple dies or chips 301, 401 having solder balls 15 on their bottom surface contacting the substrate 12, as shown in FIG. 6. The bottom of the substrate 12 is adjacent to electrical component connections 16 coupled to the circuit board 18. The ability to have an electronic package with multiple dies provides design flexibility and efficiency for the electronic package of the present invention. Each die 301, 401 in the present embodiment is positioned in close proximity to each other within an area of the electronic package adapted for high density wiring, such as the area shown in FIG. 4, by the dotted line 155 outlining a rectangular area 154 for high density, high resistance signal wiring.

Referring to FIG. 7, in a similar manner to the embodiment shown in FIGS. 1–5, a vertical signal wire or via 306 is connected to the solder ball 15 of the die 301 at the top layer of the substrate 12. A horizontal signal wire 312 is positioned between the vertical signal wire 306 and another vertical signal wire 318 positioned lower in the substrate than signal wire 312. The vertical signal wire 318 connects to a horizontal signal wire 324 which is lower in the substrate than the previous horizontal signal wire 312. The horizontal signal wire 324 is preferably positioned in an area of the package 300 having less densely packed signal wires and includes a larger vertical thickness, and lower resistance than signal wire 312. Finally, a vertical signal wire 330 connects horizontal signal wire 324 and electrical component connection 16. In a similar manner vertical signal wires 304 and 302 of the die 301 connect to vertical signal wires 328 and 326, respectively and both terminate at electrical component connections 16. In a similar manner, additional vertical signal wires 304, 302 shown in FIG. 7 are connected to solder balls 15 and with vertical signal wires 328, 326, respectively. The vertical signal wires 328, 326 terminate at electrical component connection 16 similarly to vertical signal wire 330. Further, additional vertical signal wires or vias (not shown) are preferably connected to the other solder balls 15 and extend through the substrate in a similar manner as illustrated vertical signal wires 302, 304, 306.

Similarly, the second die 401 shown in FIGS. 6 and 7 depicts a vertical signal wire or via 406 preferably having thin, densely packaged signal wires connected to horizontal signal wire 412 at a lower layer in the electronic package 300. Signal wire 424 is at a lower layer in the electronic package 300 than signal wire 412 and preferably has a greater vertical thickness and correspondingly lower resistance than horizontal signal wire 412. Signal wire 424 is connected to vertical signal wire 418 and at an opposite end connected to vertical signal wire 430 which terminates at electrical component connection 16. In a similar manner, additional vertical signal wires 404, 402 shown in FIG. 7 are connected to solder balls 15 and with vertical signal wires 428, 426, respectively. The vertical signal wires 428, 426 terminate at electrical component connection 16 similarly to vertical signal wire 430. Further, additional vertical signal wires or vias (not shown) are preferably connected to the other solder balls 15 and extend through the substrate in a similar manner as illustrated vertical signal wires 402, 404, 406.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. An electronic package device, which comprises:
   an electrical component including a plurality of connection elements on a surface thereof;
   a substrate having top and bottom surfaces being positioned beneath said electrical component and adapted to receive said connection elements of said electrical component on said top surface thereof, and said substrate defining a plurality of horizontal layers;
   a plurality of substantially horizontal conductive signal wires traversing said substrate along said horizontal layers in said substrate such that a first horizontal signal wire travels along a first substantially horizontal layer, said first signal wire includes a first vertical thickness and a first resistance value, a second horizontal signal wire travels along a second horizontal layer positioned beneath said first horizontal layer, said second signal wire having a second vertical thickness being greater than said first vertical thickness of said first horizontal signal wire and a second resistance value being lower than said first resistance value of said first horizontal signal wire;
   at least one substantially horizontal reference plane within said substrate along one of said substantially horizontal layers, said reference plane including a vertical thickness and capable of being held to a voltage potential;
   a plurality of substantially vertical conductive vias having a specified diameter, said plurality of substantially vertical vias including a first vertical via traversing a first and second of said plurality of horizontal layers such that said first via connects to at least one of said plurality of connection elements and connects to at least one of said horizontal signal wires; and
   a circuit board having connection members being positioned beneath said substrate, and connected to said substrate such that said vertical conductive vias terminate and connect to said connection members.

2. The device of claim 1 wherein said first and second vertical thickness of said first and second horizontal signal wire is less than about 150 microns.

3. The device of claim 1 wherein said first and second vertical thickness of said first and second horizontal signal wire is between about 1–150 microns.

4. The device of claim 1 wherein said diameter of said vertical conductive vias are less than about 120 microns.

5. The device of claim 1 wherein said diameter of said vertical conductive vias are between about 3–120 microns.

6. The device of claim 1 including separate reference planes having different voltages from one another.

7. The device of claim 1 including a plurality of separate reference planes each have a voltage value and at least two of said plurality of separate reference planes having a substantially similar voltage value connected by conductive vias.

8. The device of claim 1 wherein said horizontal signal wires are positioned between at least two reference planes such that said first signal wire is positioned between a first reference plane and a second reference plane, said first reference plane being positioned adjacent said first layer and including a first vertical thickness and said second reference plane being positioned adjacent said second layer and including a second vertical thickness.

9. The device of claim 1 wherein at least one of said vias communicates with a plurality of said horizontal signal wires.

10. The device of claim 1 wherein said substrate includes a plurality of separate reference planes such that said vertical thickness of each of said plurality of separate reference planes increases as each of said plurality of separate reference planes nears said bottom of said substrate.

11. An electronic package device which comprises:
    an electrical component including a plurality of connection elements on a surface thereof;
    a substrate having top and bottom surfaces being positioned beneath said electrical component and adapted to receive said connection elements of said electrical component on said top surface thereof, and said substrate defining a plurality of horizontal layers;
    a plurality of substantially horizontal conductive signal wires traversing said substrata along said horizontal layers in said substrate such that a first horizontal signal wire travels along a first substantially horizontal layer, said first signal wire includes a first vertical thickness and a first resistance value, a second horizontal signal wire travels along a second horizontal layer positioned beneath said first horizontal layer, said second signal wire having a second vertical thickness being greater than said first vertical thickness of said first horizontal signal wire and a second resistance value being lower than said first resistance value of said first horizontal signal wire, said plurality of said conductive signal wires alternate thicknesses such that said first signal wire includes said first vertical thickness and said second signal wire includes said second vertical thickness and a third horizontal signal wire traveling along a third substantially horizontal layer positioned beneath said second horizontal layer in said substrate includes a third vertical thickness substantially equal to said first vertical thickness and a fourth horizontal signal wire travels along a fourth substantially horizontal layer positioned beneath said third horizontal layer in said substrate and includes a fourth vertical thickness substantially equal to said second vertical thickness;
    at least one substantially horizontal reference plane within said substrate along one of said substantially horizontal layers, said reference plane including a vertical thickness and capable of being held to a voltage potential;
    a plurality of substantially vertical conductive vias having a specified diameter, said plurality of substantially vertical vias including a first vertical via traversing a first and second of said plurality of horizontal layers such that said first via connects to at least one of said plurality of connection elements and connects to at least one of said horizontal signal wires; and
    a circuit board having connection members being positioned beneath said substrate, and connected to said substrate such that said vertical conductive vias terminate and connect to said connection members.

12. An electronic package device, which comprises:
    an integrated circuit including a plurality of connection elements on a surface thereof;

a substrate having top and bottom surfaces being positioned beneath said integrated circuit and adapted to receive said connection elements of said integrated circuit on said top surface thereof, and said substrate defining a plurality of horizontal layers;

a plurality of substantially horizontal conductive signal wires traversing said substrate along said horizontal layers in said substrate such that a first horizontal signal wire travels along a first substantially horizontal layer, said first signal wire includes a first vertical thickness of less than about 150 microns and a first resistance measurement, a second horizontal signal wire travels along a second horizontal layer positioned beneath said first horizontal layer in said substrate, said second signal wire having a second vertical thickness being greater than said first vertical thickness of said first horizontal signal wire and a second resistance measurement being lower than said first resistance measurement of said first signal wire;

a plurality of reference planes within said substrate along said substantially horizontal layers and including a vertical thickness, said horizontal signal wires being positioned between at least two of said reference planes such that said first signal wire is positioned between a first reference plane having a first vertical thickness and a second reference plane having a second vertical thickness and said first reference plane being positioned along said first layer and said second reference plane being positioned along said second layer, at least one of said plurality of reference planes includes conductive metal being held to a voltage potential;

a plurality of substantially vertical conductive vias having a specified diameter of less than about 100 microns, said plurality of substantially vertical conductive vias including a first vertical via traversing a first and second of said plurality of horizontal layers such that said first vertical conductive via connects to at least one of said plurality of connection elements of said integrated circuit and connects with at least one of said horizontal signal wires; and a circuit board having connection members and being positioned beneath said substrate such that said vertical conductive vias connect and terminate with said connection members of said circuit board.

13. The device of claim 12 wherein said plurality of reference planes include different voltages from one another.

14. The device of claim 12 wherein said reference planes each have a voltage value and said reference planes having a substantially similar voltage value are connected.

15. The device of claim 12 wherein at least one of said vertical vias communicates with a plurality of said horizontal signal wires.

16. The electronic package device of claim 1 wherein said reference plane is held to said voltage potential by connection to an external or internal power source.

17. The electronic package device of claim 12 wherein said at least one of said plurality of reference planes is held to a voltage potential by connection to an external or internal power source.

18. The device of claim 11 wherein said first and second vertical thickness of said first and second horizontal signal wire is less than about 150 microns.

19. The device of claim 11 wherein said first and second vertical thickness of said first and second horizontal signal wire is between about 1–150 microns.

20. The device of claim 11 wherein said diameter of said vertical conductive vias are less than about 120 microns.

21. The device of claim 11 wherein said diameter of said vertical conductive vias are between about 3–120 microns.

22. The device of claim 11 including separate reference planes having different voltages from one another.

23. The device of claim 11 including a plurality of separate reference planes each have a voltage value and at least two of said plurality of separate reference planes having a substantially similar voltage value connected by conductive vias.

24. The device of claim 11 wherein said horizontal signal wires are positioned between at least two reference planes such that said first signal wire is positioned between a first reference plane and a second reference plane, said first reference plane being positioned adjacent said first layer and including a first vertical thickness and said second reference plane being positioned adjacent said second layer and including a second vertical thickness.

25. The device of claim 11 wherein at least one of said vias communicates with a plurality of said horizontal signal wires.

26. The device of claim 11 wherein said substrate includes a plurality of separate reference planes such that said vertical thickness of each of said plurality of separate reference planes increases as each of said plurality of separate reference planes nears said bottom of said substrate.

* * * * *